(12) United States Patent
Shubham et al.

(10) Patent No.: US 12,356,167 B2
(45) Date of Patent: Jul. 8, 2025

(54) DUAL-DIAPHRAGM MEMS TRANSDUCERS WITH HIGH EFFECTIVE AREA

(71) Applicant: Knowles Electronics, LLC, Itasca, IL (US)

(72) Inventors: Shubham Shubham, Schaumburg, IL (US); Jim Guo, Buffalo Grove, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 264 days.

(21) Appl. No.: 17/825,804

(22) Filed: May 26, 2022

(65) Prior Publication Data
US 2023/0388713 A1 Nov. 30, 2023

(51) Int. Cl.
*H04R 7/10* (2006.01)
*H04R 1/08* (2006.01)
*H04R 7/16* (2006.01)

(52) U.S. Cl.
CPC ............... *H04R 7/10* (2013.01); *H04R 1/08* (2013.01); *H04R 7/16* (2013.01); *B81B 2203/0361* (2013.01); *H04R 2201/003* (2013.01)

(58) Field of Classification Search
CPC ... H04R 7/10; H04R 1/08; H04R 7/16; H04R 2201/003; H04R 19/04; H04R 19/005; H04R 31/00; B81B 2203/0361; B81B 2203/0369; B81B 2203/0376; B81B 2203/0392; B81B 2203/0384
USPC ........ 181/157, 163, 164, 165, 173; 381/174, 381/423
See application file for complete search history.

(56) References Cited

U.S. PATENT DOCUMENTS

| | | | |
|---|---|---|---|
| 9,181,080 B2 * | 11/2015 | Dehe | H04R 7/02 |
| 10,433,070 B2 * | 10/2019 | Dehe | B81C 1/00166 |
| 10,469,958 B2 * | 11/2019 | Barzen | B81B 3/0051 |
| 10,555,088 B2 * | 2/2020 | Meisel | H04R 19/005 |
| 11,206,493 B2 * | 12/2021 | Yang | H04R 7/06 |
| 2023/0339743 A1 * | 10/2023 | Timme | H04R 7/08 |

* cited by examiner

*Primary Examiner* — Dedei K Hammond
*Assistant Examiner* — Jennifer B. Olson
(74) *Attorney, Agent, or Firm* — Flener IP & Business Law; Zareefa Flener; Yongae Jun

(57) ABSTRACT

A microelectromechanical systems (MEMS) diaphragm assembly comprises a first diaphragm and a second diaphragm, a geometric central region surrounding the geometric center of the diaphragm assembly, and a plurality of pillars connecting the first and second diaphragms, each of the plurality of pillars having a cross-sectional shape having a maximum radial dimension, A, and a maximum circumferential dimension, B, wherein at least a first subset of the plurality of pillars is disposed within the geometric central region and wherein A is greater than B for the at least first sub set.

20 Claims, 8 Drawing Sheets

DUAL-DIAPHRAGM MEMS TRANSDUCERS WITH HIGH EFFECTIVE AREA

FIELD OF THE DISCLOSURE

The present disclosure relates generally to a microelectromechanical systems (MEMS) diaphragm assembly, and more particularly to a MEMS diaphragm assembly having a plurality of pillars having geometric shapes and orientations resulting in an increased effective area.

BACKGROUND

It is known that in the fabrication of MEMS devices often a plurality of devices are manufactured in a single batch process wherein individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes use as an acoustic transducer or other portion of a microphone.

The vibrational response to acoustic stimuli of a dual-diaphragm assembly includes a distribution of velocity over the assembly. Integrating the velocity distribution of the assembly over the entire assembly for a given acoustic stimuli provides a measure of performance known as an acoustic effective area for the assembly. Similarly, integrating the velocity distribution of the assembly over the electrode area of the assembly for a given acoustic stimuli provides a measure of performance known as an electric effective area for the assembly. It has been observed that increasing the acoustic effective area for the assembly decreases the acoustic damping for the assembly, and that increasing the electric effective area for the assembly increases the sensitivity and active capacitance for the assembly, all of which is desirable. A need therefore exists for a dual-diaphragm assembly having a structure that results in increased acoustic and electrical effective areas.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

Figure 1:
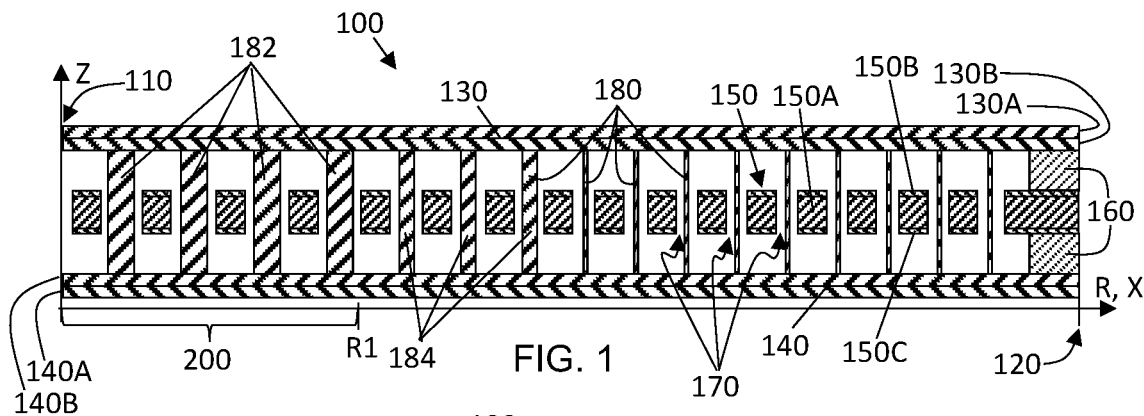
FIG. 1 is a cross-sectional schematic view of a MEMS diaphragm assembly, according to an embodiment.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

According to various embodiments described herein, a MEMS diaphragm assembly comprises a first diaphragm and a second diaphragm, a geometric central region surrounding the geometric center of the diaphragm assembly, and a plurality of pillars connecting the first and second diaphragms, each of the plurality of pillars having a cross-sectional shape having a maximum radial dimension, A, and a maximum circumferential dimension, B, wherein at least a first subset of the plurality of pillars is disposed within the geometric central region and wherein A is greater than B for the at least first subset.

According to other embodiments, A and B are constant within the geometric central region, and A is smaller at the outer periphery of the MEMS diaphragm assembly than within the geometric central region. In an embodiment the outer edge of the geometric central region is disposed in a range of about 30% to 70% of the distance between the geometric center and the outer periphery of the MEMS diaphragm assembly. In other embodiments the outer edge of the geometric central region is disposed in a range of about 50% to 70% or in a range of about 60% to 70% of the distance between the geometric center and the outer periphery of the MEMS diaphragm assembly.

In an embodiment A is constant from the outer edge of the geometric central region to the outer periphery of the MEMS diaphragm assembly. In an embodiment the region between the outer edge of the geometric central region and the outer periphery comprises a plurality of concentric annular regions, and wherein A and B are constant within each of the plurality of concentric annular regions. In an embodiment B is constant and A decreases from the geometric center out to the outer edge of the geometric central region and both A and B remain constant from the outer edge of the geometric central region to the outer periphery of the MEMS diaphragm assembly.

In an embodiment the geometric central region comprises a central core region surrounded by a plurality of concentric annular regions, and wherein A and B are constant within each of the central core region and the plurality of concentric annular regions. In various embodiments, the cross-sectional shapes of the plurality of pillars is selected from the group of shapes consisting of an ellipse, a rectangle, a diamond shape, an irregular pentagon, an irregular hexagon, an egg shape, an irregular heptagon, an irregular octagon, an irregular ten-sided polygon, an irregular twelve-sided polygon, and combinations thereof.

In an embodiment a MEMS die comprises a substrate having an opening formed therein and an embodiment of a MEMS diaphragm assembly as described hereinabove attached around a periphery thereof to the substrate and over the opening. In a further embodiment, a microphone device comprises the MEMS die as described hereinabove and a housing having a sound port, wherein the MEMS die is disposed within the housing, and wherein the sound port is acoustically coupled to the MEMS die.

Turning to FIG. 1, a MEMS diaphragm assembly generally labeled with the reference numeral 100 according to an embodiment is shown schematically in a cross-sectional view of the assembly taken in the X-Z plane (or R-Z plane as will be explained) showing a portion of the assembly between a geometric center 110 and an outer periphery 120 of the MEMS diaphragm assembly 100. In an embodiment, the MEMS diaphragm assembly 100 includes a first diaphragm 130 and a second diaphragm 140, each of which can comprise more than one layer of material as illustrated.

Figure 5:
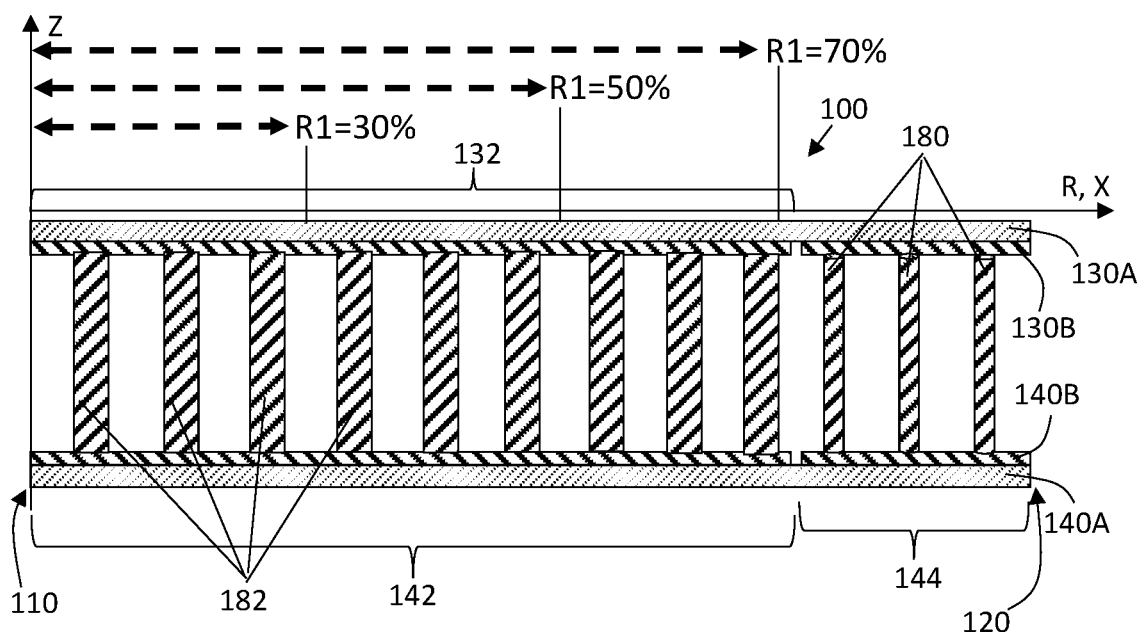
FIG. 5 is a cross-sectional schematic view of a MEMS diaphragm assembly, showing a range of values for the outer boundary of the geometric central region, according to multiple embodiments.

In an embodiment the first diaphragm 130 includes an insulative layer 130A and a conductive layer 130B, and the second diaphragm 140 includes an insulative layer 140A and a conductive layer 140B. The electrically active region of the conductive layer 130B of the first diaphragm 130 may be referred to as a first movable electrode 132, which is shown for reference on FIG. 5. Similarly, the electrically active region of the conductive layer 140B of the second diaphragm 140 may be referred to as a second movable electrode 142, which is also shown for reference on FIG. 5. In an embodiment, the first and second movable electrodes 132, 142 together define the radial extent of a sensing area for the diaphragm assembly 100. In an embodiment, the portion of the diaphragm assembly 100 that is radially beyond of the sensing area, and denoted by reference numeral 144 in FIG. 5, is a non-sensing area.

In an embodiment, a stationary electrode assembly 150 is disposed between the first diaphragm 130 and the second diaphragm 140. The first diaphragm 130 and the second diaphragm 140 are connected to the stationary electrode assembly 150 around their outer peripheries 120 by spacer layers 160. In an embodiment the stationary electrode assembly 150 includes an insulative layer 150A, a first conductive layer 150B, and a second conductive layer 150C. The insulative layer 150A is sandwiched between the first conductive layer 150B and the second conductive layer 150C.

In one embodiment, the first conductive layer 150B and the second conductive layer 150C are shorted together so as to form a single electrode (also referred to herein as a stationary electrode), which faces the first movable electrode and also faces the second movable electrode. In another embodiment, the first conductive layer 150B and the second conductive layer 150C are electrically isolated from one another, and may be respectively referred to as a first stationary electrode (which faces the first movable electrode) and a second stationary electrode (which faces the second movable electrode). In an embodiment, the stationary electrode assembly 150 is relatively thick and/or stiff compared to the first and second diaphragms 130 and 140, for example by being fabricated using thicker materials or using thin very high tensile stress films to maintain sufficient rigidity. The stationary electrode assembly 150 remains relatively motionless when the first and second diaphragms 130 and 140 are deflected.

The material of any of the insulative layers 130A, 140A, and 150A can be any insulative material that would not be damaged during a sacrificial layer removal process. For example, without limitation, the insulative material can be silicon nitride, silicon oxynitride, metal oxides, polymers, materials that are not damaged by a sacrificial layer removal process, and combinations thereof. Similarly, the material of any of the conductive layers 130B, 140B, 150B, and 150C can be any conductive material that would not be damaged during a sacrificial layer removal process. For example, without limitation, the conductive material can be polycrystalline silicon, one or more metals, alloys of metals, carbon, materials that are not damaged by a sacrificial layer removal process, and combinations thereof. The structural geometry of materials comprising the first and second diaphragms 130 and 140 and the stationary electrode assembly 150 can be other than those described hereinabove in other embodiments.

Still referring to FIG. 1, in an embodiment the stationary electrode assembly 150 includes a plurality of apertures 170 disposed therethrough (i.e., the apertures are disposed through the stationary electrode or through the first and second stationary electrodes). In an embodiment a plurality of pillars 180 connects the first diaphragm 130 to the second diaphragm 140, wherein each pillar 180 has a first end connected to the first diaphragm 130 and a second end connected to the second diaphragm 140, and wherein each pillar 180 passes through an aperture 170 of the plurality of apertures 170.

Figure 2:
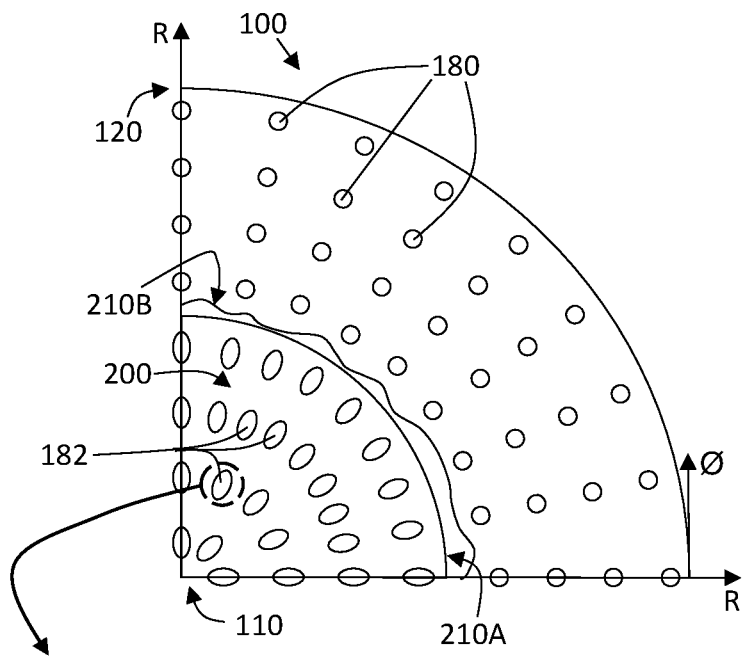
FIG. 2 is a top plan schematic view of a MEMS diaphragm assembly, according to another embodiment.
Figure 3A:
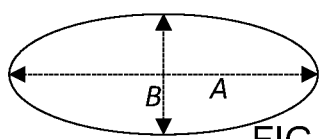
FIGS. 3A through 3K are exemplary cross-sectional shapes for the plurality of pillars.
Figure 3E:
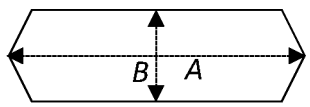
Figure 3H:
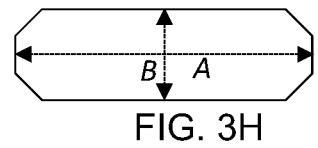
Figure 3B:
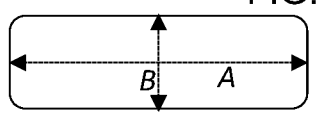
Figure 3F:
Figure 3I:
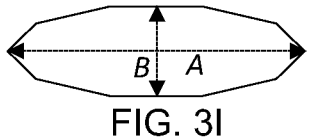
Figure 3C:
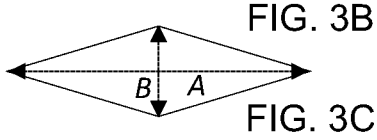
Figure 3G:
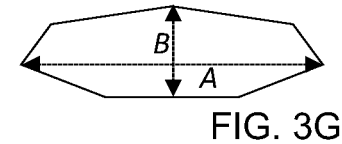
Figure 3J:
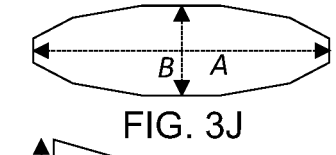
Figure 3D:
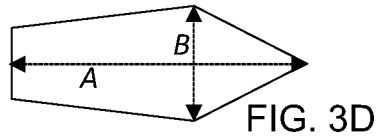
Figure 3K:
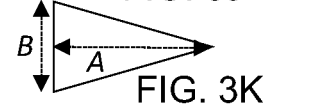
Figure 4:
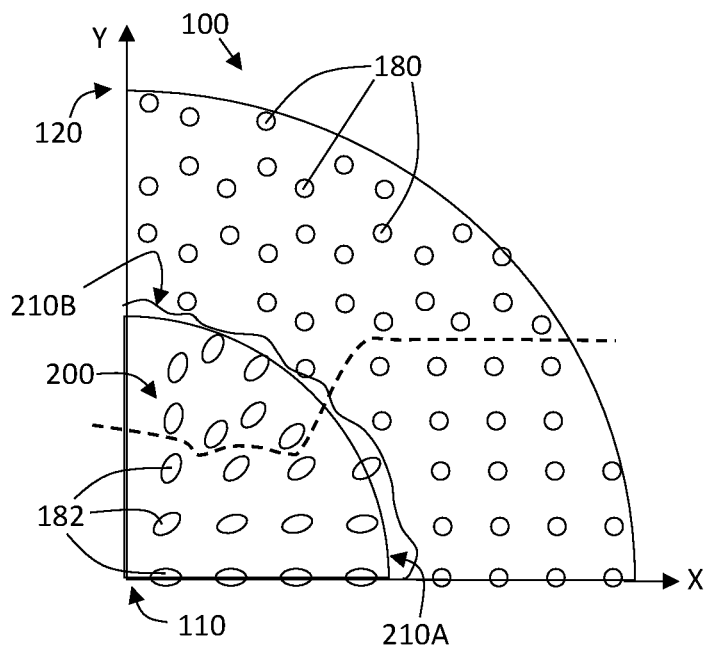
FIG. 4 is a top plan schematic view of a MEMS diaphragm assembly, showing exemplary relative arrangements of the plurality of pillars according to two embodiments.

FIGS. 2 and 4 illustrate top plan views of exemplary arrangements of the plurality of pillars 180. FIG. 2 illustrates a radial/circumferential (R, Ø) grid arrangement and FIG. 4 illustrates both a hexagonal grid arrangement and a rectangular grid arrangement on a cartesian (X,Y) plane. Referring to FIG. 2, in the radial/circumferential grid arrangement, the plurality of pillars 180 is arranged along radial lines flowing outwardly from the geometric center 110. Referring to FIG. 4, the plurality of pillars 180 shown above the dashed line is arranged in a hexagonal arrangement relative to each other, whereas the plurality of pillars 180 shown below the dashed line is arranged in a rectangular arrangement relative to each other. Other arrangements of the plurality of pillars 180 are also possible. Whether the plurality of pillars 180 is arranged based on a radial/circumferential coordinate system (R, Ø) as shown in FIG. 2 or a cartesian (X,Y) coordinate system as shown in FIG. 4, or another pattern of arrangement, it is important to note that the spacing of the plurality of pillars 180 can be the same or different in the X and Y directions (FIG. 4) or in the R and Ø directions (FIG. 2).

Referring now to FIGS. 2 and 4, each of the plurality of pillars 180 has a cross-sectional shape having a radially oriented maximum dimension (measured in the R direction), A, and a circumferentially oriented maximum dimension (measured in the Ø direction), B. The dimension A is greater than the dimension B for the at least first subset 182 (and also for a second subset 184, a third subset 186, and additional subsets in other embodiments). Regardless of whether the plurality of pillars 180 is arranged along radial lines as shown in FIG. 2, or in a hexagonal or rectangular pattern as shown in FIG. 4, the at least first subset 182 (and also second subset 184, third subset 186, and additional subsets in other embodiments) of pillars is always arranged so that the larger dimension A of each pillar 182 (184, 186) is oriented along a radial line and the smaller dimension B of each pillar 182 (184, 186) is oriented circumferentially. In an embodiment at least a first subset 182 of the plurality of pillars 180 is disposed within the geometric central region 200.

The individual pillars of the subsets 182, 184, 186 of the plurality of pillars 180 can have any regular or irregular cross-sectional shape as long as A is greater than B, including without limitation the shapes illustrated in FIGS. 3A through 3K: an ellipse (FIG. 3A), a rectangle (FIG. 3B), a diamond shape (FIG. 3C), an irregular pentagon (FIG. 3D), an irregular hexagon (FIG. 3E), an egg shape (FIG. 3F), an irregular heptagon (FIG. 3G), an irregular octagon (FIG. 3H), an irregular nine-sided polygon (not shown), an irregular ten-sided polygon (FIG. 3I), an irregular eleven-sided polygon (not shown), an irregular twelve-sided polygon (FIG. 3J), a triangle (FIG. 3K), and combinations thereof.

Referring again to FIG. 1, for example, in this embodiment of the MEMS diaphragm assembly 100, the plurality of pillars 180 includes the first subset 182 illustrated by the left-most four pillars, a second subset 184 of the plurality of pillars 180 illustrated by the next three pillars to the right, and the rest of the plurality of pillars 180 to the further right. In this embodiment both of the subsets 182 and 184 have a radial dimension A that is greater than a circumferential dimension B, and the first subset 182 has a value of the dimension A that is greater than the value of A for the second subset 184, which is greater than the value A for the rest of the plurality of pillars 180 as can be seen by the relative thicknesses of the pillars 182, 184, 180 visible in FIG. 1. In any of the embodiments described herein, the value of the circumferentially measured maximum dimension B for the plurality of pillars 180 can decrease or remain constant going from the geometric center 110 out to the outer periphery 120.

All of the plurality of pillars 180 in FIG. 1 are illustrated to be evenly spaced in the R direction; however, in other embodiments the spacing of the plurality of pillars 180 can vary with radius from the geometric center 110 and can, for example, be spaced further apart in the R, X direction going from the geometric center 110 on the left toward the outer periphery 120 on the right. FIG. 1 represents an embodiment of the MEMS diaphragm assembly 100 comprising a geometric central region 200, for example, approximately bounded by radius R1 surrounding the geometric center, wherein the dimensions A and B are constant with A greater than B within the geometric central region, and wherein A is smaller at the outer periphery 120 of the MEMS diaphragm assembly 100 than within the geometric central region 200.

Referring now to FIG. 5, in an embodiment the outer edge of the geometric central region 200 as denoted by the reference R1 on the R axis is illustrated at three positions in a range of about 30% to 70% of the distance between the geometric center 110 and the outer periphery 120 of the MEMS diaphragm assembly 100. The first subset of pillars 182 is shown extending out to R1=70% in this embodiment. Without being held to theory, it has been demonstrated that the acoustic effective area for the MEMS diaphragm assembly 100 can be increased by including at least a first subset 182 of the plurality of pillars 180 having the radial dimension A greater than the circumferential dimension B within the geometric central region 200 approximately bounded by R1. Further, it has been shown that increasing the radius R1 of the geometric central region out to about 70% results in a further increase of the acoustic effective area; however, increasing R1 beyond about 70% results in a decrease in the acoustic effective area.

In an embodiment the outer edge R1 of the geometric central region 200 is disposed in a range of about 30% to 70% of the distance between the geometric center 110 and the outer periphery 120 of the MEMS diaphragm assembly 100. In another embodiment the outer edge R1 of the geometric central region 200 is disposed in a range of about 50% to 70% of the distance between the geometric center 110 and the outer periphery 120 of the MEMS diaphragm assembly 100. In a further embodiment, the outer edge R1 of the geometric central region 200 is disposed in a range of about 60% to 70% of the distance between the geometric center 110 and the outer periphery 120 of the MEMS diaphragm assembly 100. In an embodiment, A is constant for all of the plurality of pillars 180 from the outer edge R1 of the geometric central region 200 to the outer periphery 120 of the MEMS diaphragm assembly 100.

Figure 6:
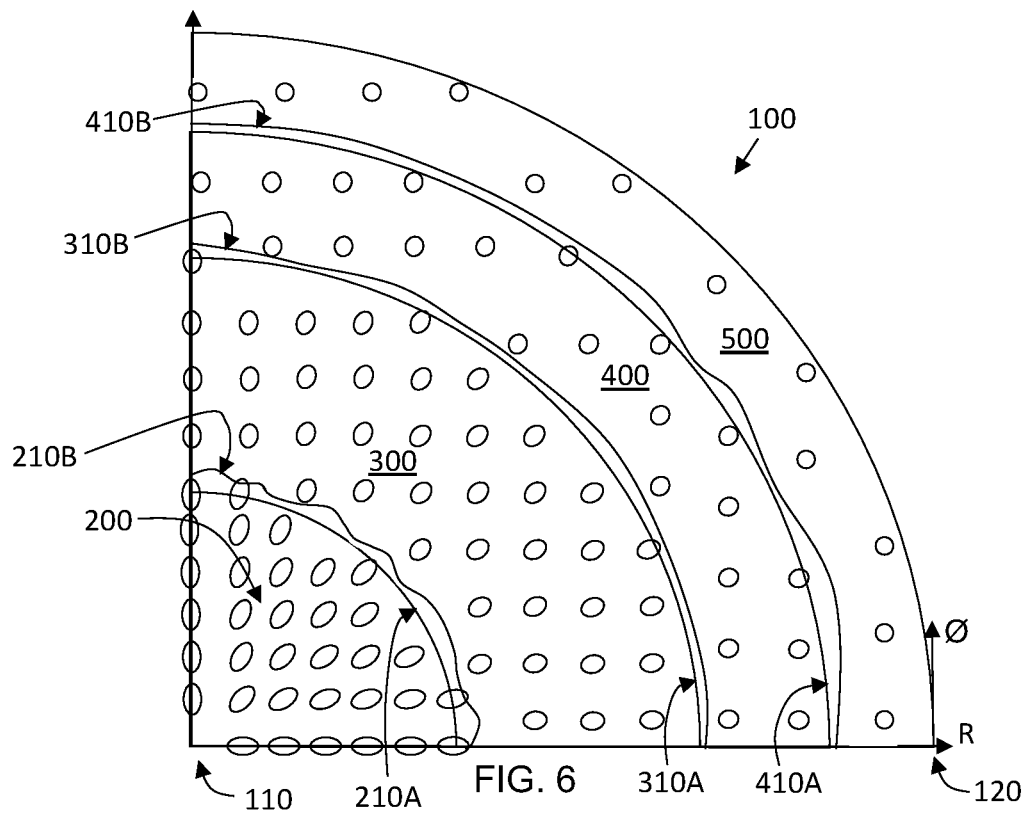
FIG. 6 is a top plan schematic view of a MEMS diaphragm assembly, according to yet another embodiment.
Figure 7:
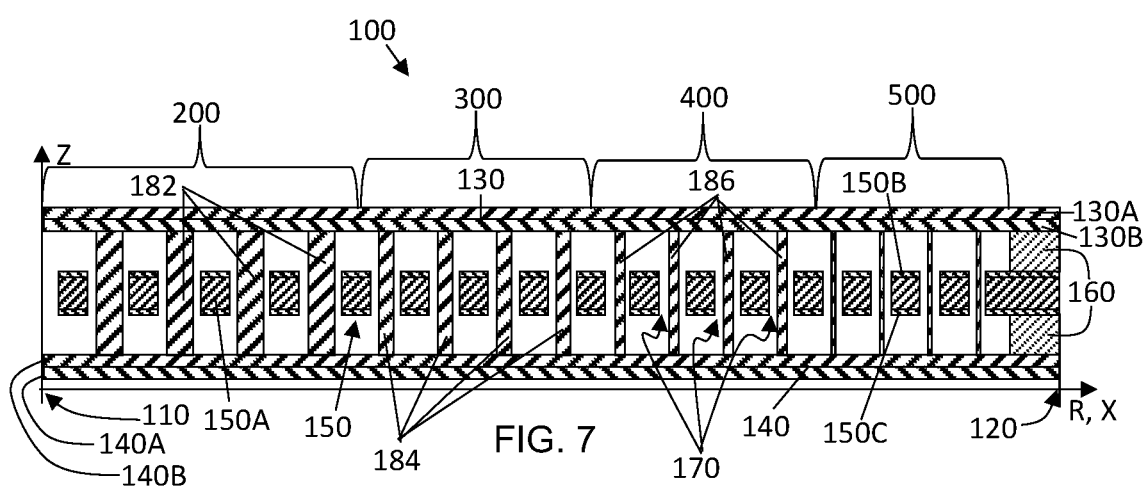
FIG. 7 is a cross-sectional schematic view of the MEMS diaphragm assembly shown in cross-section in FIG. 6.

Referring to FIGS. 6 and 7, in an embodiment the region between the outer edge of the geometric central region 200 and the outer periphery 120 comprises a plurality of generally concentric annular regions, for example, 300, 400, and 500 as shown, wherein A is greater than B at least for the subsets 182, 184, and 186 of the plurality of pillars 180 disposed within the geometric central region 200, and the generally concentric annular regions 300 and 400, respectively, and wherein A and B are constant for all of the plurality of pillars 180 within each of the geometric central region 200 and the plurality of concentric annular regions 300, 400, 500. Once again, in this embodiment A is smaller at the outer periphery 120 of the MEMS diaphragm assembly 100 than within the geometric central region 200.

Referring to FIGS. 2, 4, and 6 illustrating the plan views of the arrangements of the plurality of pillars 180, the MEMS diaphragm assembly 100 is illustrated has having a geometric central region 200 surrounding the geometric center 110. The geometric central region 200 is bounded at an outer edge that may be of constant radius as shown by the arc 210A or that may vary across a range of radii as shown by the line 210B. Regardless of its actual shape, the outer edge 210A, 210B separates the MEMS diaphragm assembly 100 into the geometric central region 200 and the region between the outer edge 210A, 210B and the outer periphery 120.

Referring in particular to FIG. 6, in this embodiment the region between the outer edge 210A, 210B of the geometric central region 200 and the outer periphery 120 comprises a plurality of generally concentric annular regions, for example, the regions 300, 400, 500 as illustrated. The outermost generally concentric annular region 500 in this example is bounded by the outer periphery 120 of the MEMS diaphragm assembly 100. The other generally concentric annular regions 300 and 400 in this example that are disposed between the geometric central region 200 and the outermost annular region 500 are separated by boundaries that may be of constant radius as shown by the arcs 310A and 410A or that may vary across a range of radii as shown by the lines 310B and 410B.

Regardless of their actual shape, the boundaries 310A, 310B and 410A, 410B separate the region between the outer edge 210A, 210B of the geometric central region 200 and the outer periphery 120 into the plurality of generally concentric annular regions 300, 400, 500 in this embodiment. Three concentric annular regions 300, 400, 500 are illustrated in FIG. 6; however, in other embodiments there can be four, five, six, or more concentric annular regions.

Figure 8:
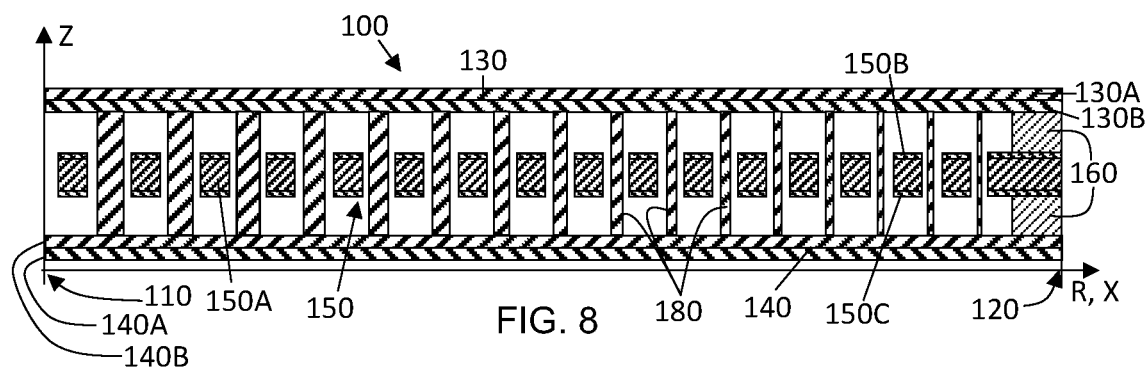
FIG. 8 is a cross-sectional schematic view of a MEMS diaphragm assembly, according to yet a further embodiment.
Figure 9:
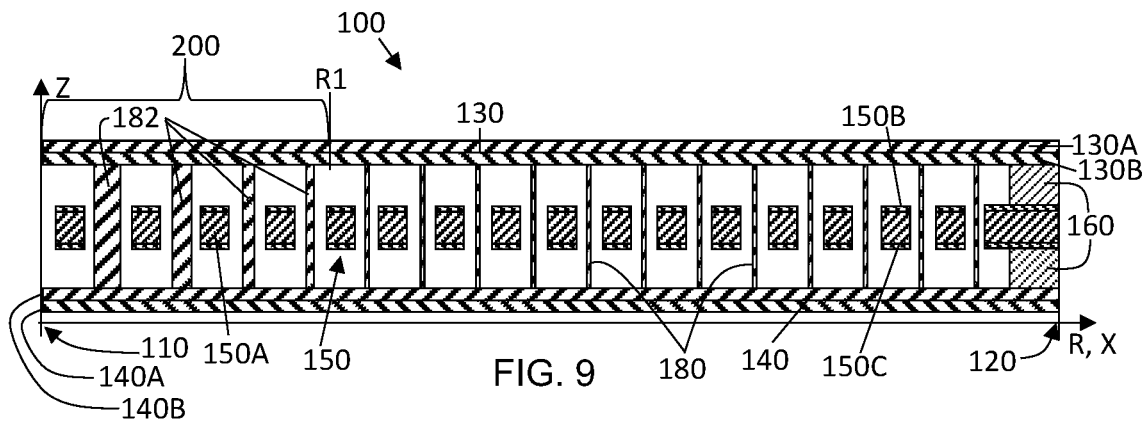
FIG. 9 is a cross-sectional schematic view of a MEMS diaphragm assembly, according to a still further another embodiment.

Referring to FIG. 8, in an embodiment of the MEMS diaphragm assembly 100, the pillar 180 closest to the geometric center 110 has the largest dimension A, and the pillars 180 distributed radially toward the outer periphery 120 have gradually decreasing values for A. In this embodiment, some or all of the plurality of pillars 180 have a radially measured maximum dimension A that is greater than a circumferentially measured maximum dimension B. Referring to FIG. 9, in an embodiment of the MEMS diaphragm assembly 100, the first subset 182 of the plurality of pillars 180 that is disposed within the geometric central region 200 has values of A that are greater than B, wherein the value of the dimension B is constant and the value of A decreases from the geometric center 110 out to the outer edge R1 of the geometric central region 200 and wherein both A and B remain constant from the outer edge R1 of the geometric central region 200 to the outer periphery 120 of the MEMS diaphragm assembly 100.

Figure 10:
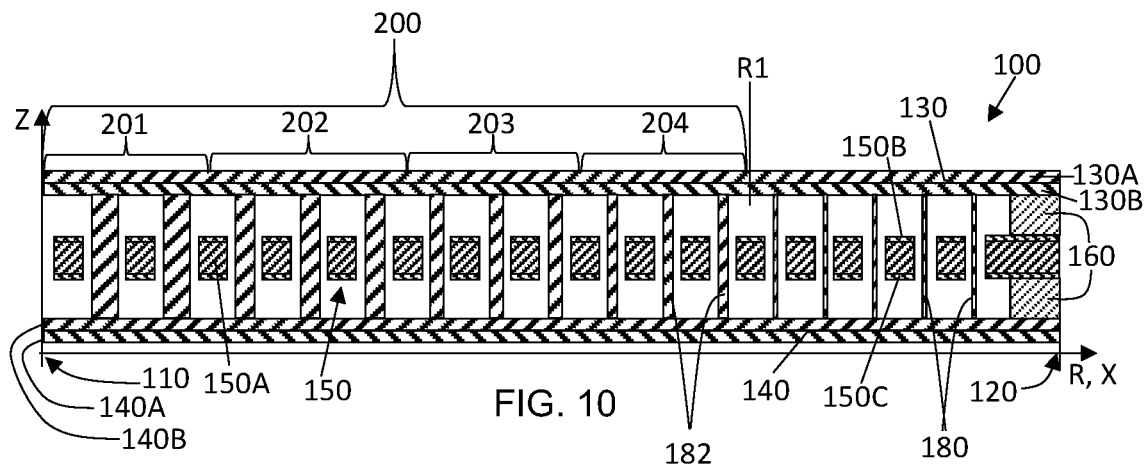
FIG. 10 is a cross-sectional schematic view of a MEMS diaphragm assembly, according to yet another embodiment.
Figure 11:
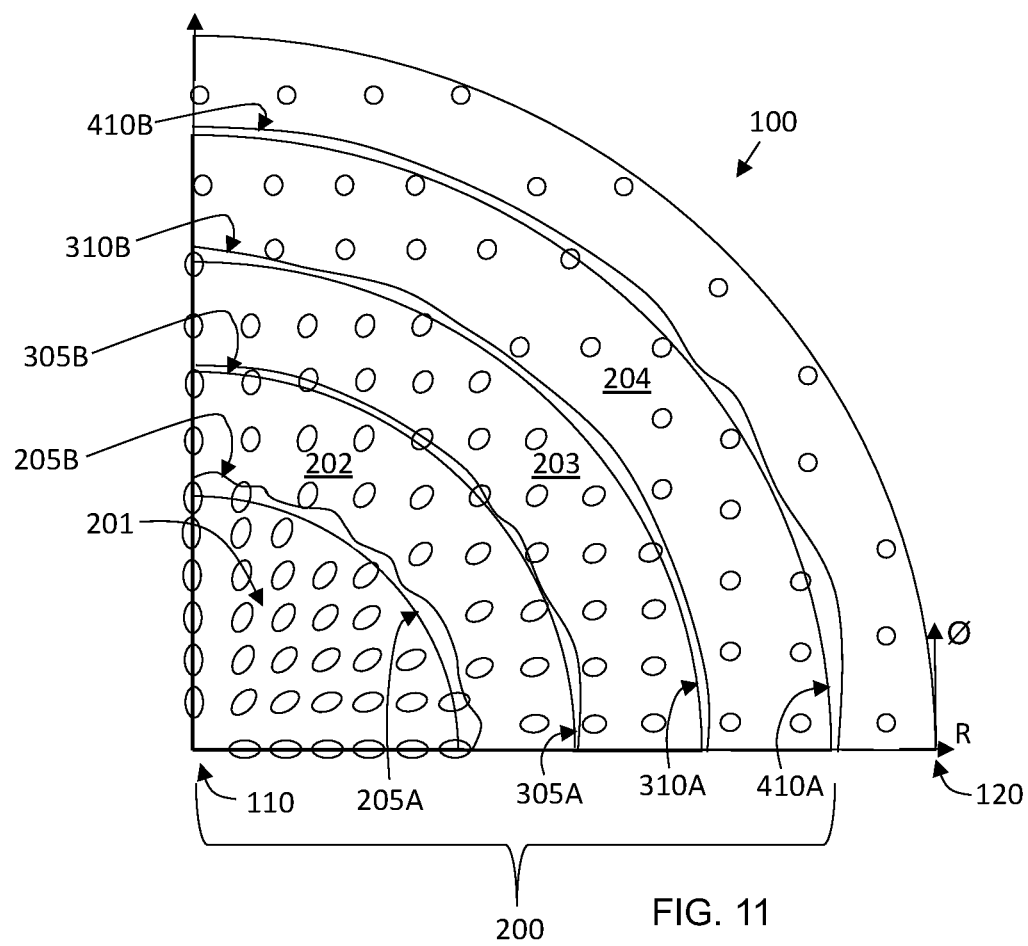
FIG. 11 is a top plan schematic view of the MEMS diaphragm assembly shown in cross-section in FIG. 10.

Referring to FIGS. 10 and 11, in an embodiment the geometric central region 200 comprises a central core region 201 surrounded by a plurality of generally concentric annular regions, for example, regions 202, 203, and 204 as illustrated, wherein the first subset 182 of the plurality of pillars 180 that is disposed within the geometric central region 200 has values of A that are greater than B, and wherein A decreases going from region 201 to region 202 to region 203 to region 204 to the region radially beyond region 204. In this embodiment A and B are constant within each of the central core region 201 and the plurality of generally concentric annular regions 202, 203, 204. The generally concentric annular regions 202, 203, 204 in this embodiment are separated from the central core region 201, from each other, and from the region outside of the geometric central region 200 by boundaries that may be of constant radius as shown by the arcs 205A, 305A, 310A, and 410A, respectively, or that may vary across a range of radii as shown by the lines 205B, 305B, 310B, and 410B, respectively. Three generally concentric annular regions 202, 203, 204 are illustrated; however, in other embodiments there can be four, five, six, or more generally concentric annular regions within the geometric central region 200.

Figure 12:
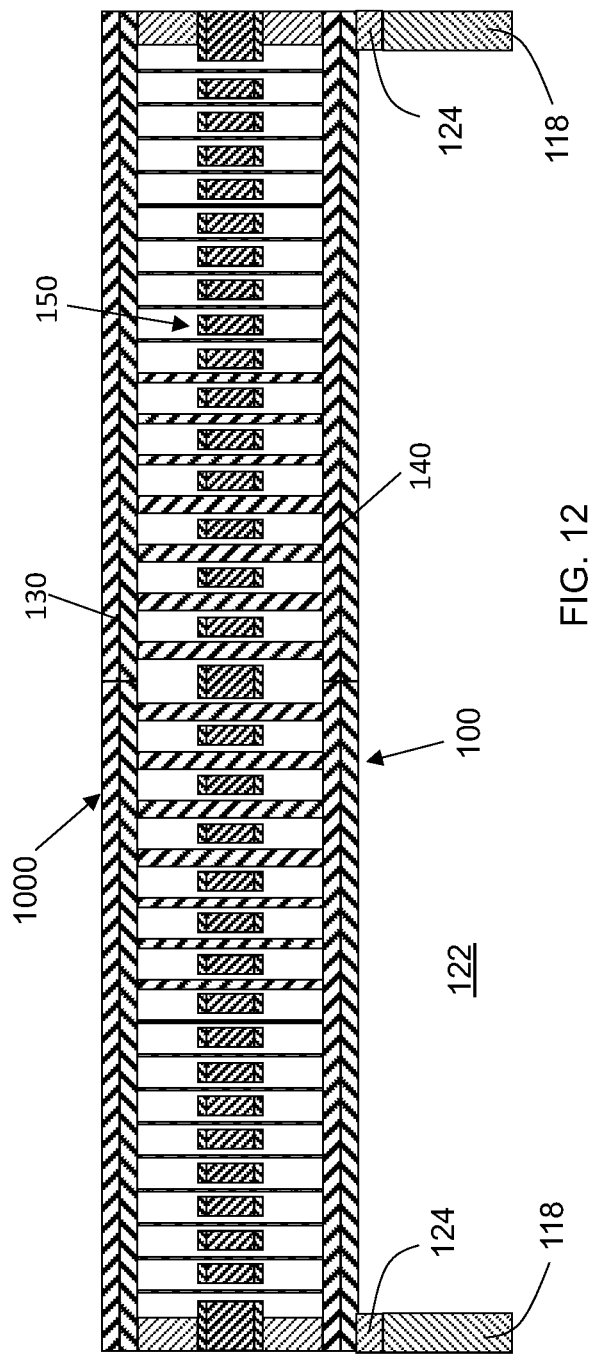
FIG. 12 is a cross-sectional schematic view of an exemplary MEMS die utilizing an embodiment of the MEMS diaphragm assembly.

Referring to FIG. 12, in an embodiment a MEMS die 1000, for example, used as an acoustic transducer 1000 includes the MEMS diaphragm assembly 100 attached to a substrate 118, shown in cross-section in FIG. 12. In an embodiment the substrate 118 has a generally rectangular perimeter when viewed from above in FIG. 12, but in other embodiments it can be any shape. The substrate 118 in an embodiment includes an opening 122 formed therethrough.

In an embodiment the second diaphragm 140 is attached around the outer periphery 120 thereof to the substrate 118 over the opening 122 via a spacer layer 124. In other embodiments at least a portion of the second diaphragm 140 is attached directly to the substrate 118. In some embodiments the spacer layer 124 can be an integral part of the substrate 118 or added onto the substrate 118 as an additional sacrificial layer 124. The spacer layer 124 can, for example, be made of any insulative material as described hereinabove. In an embodiment the substrate 118 is made of silicon.

Figure 13:
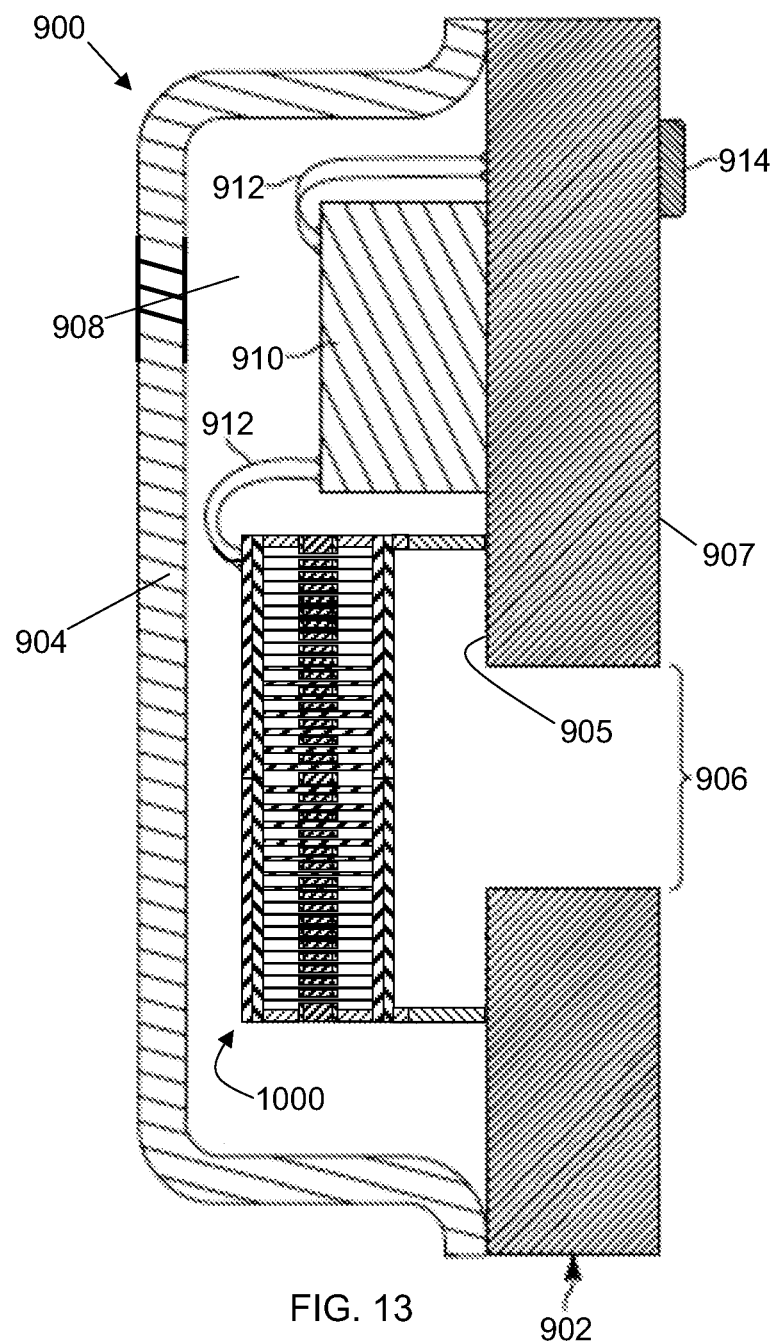
FIG. 13 is a cross-sectional schematic view of an exemplary microphone device utilizing the exemplary MEMS die of FIG. 12.
Figure 14:
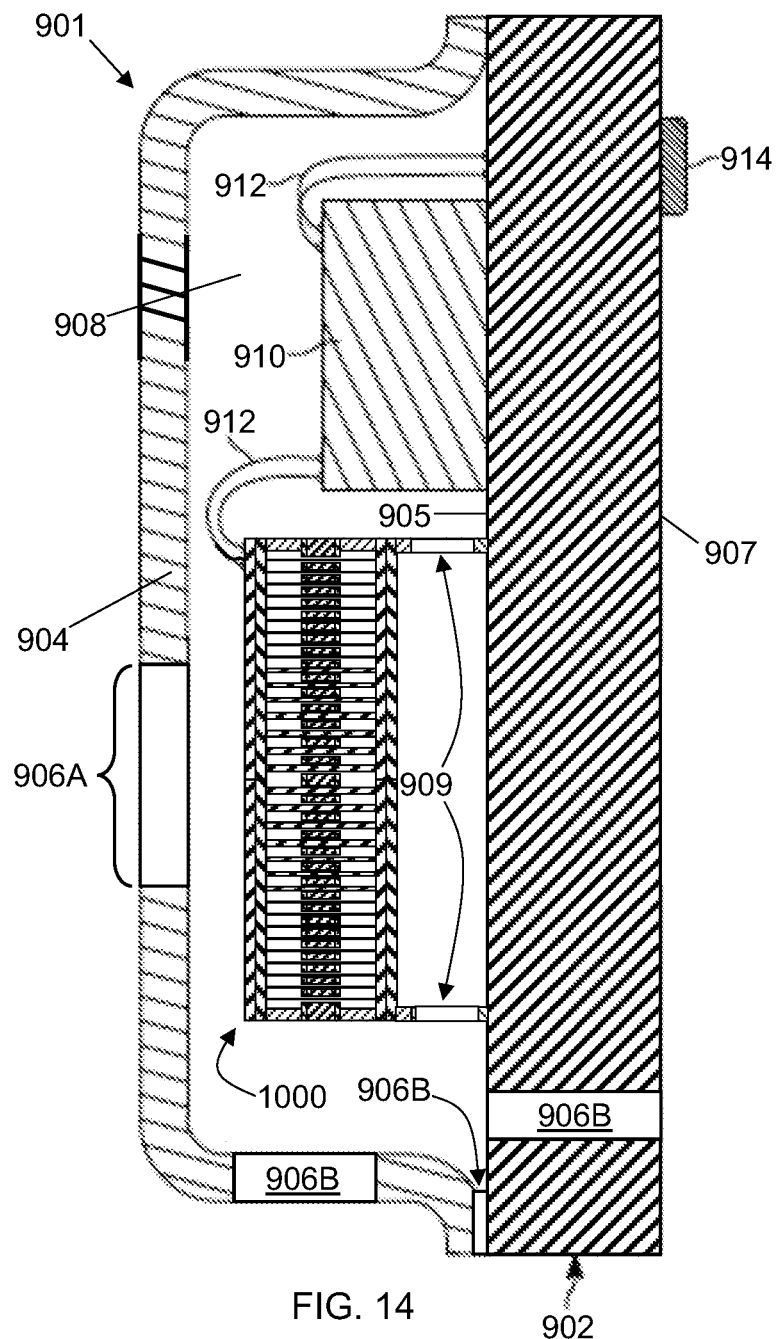
FIG. 14 is a cross-sectional schematic view of another exemplary microphone device utilizing the exemplary MEMS die of FIG. 12.

FIGS. 13 and 14 illustrate some exemplary embodiments of a microphone device 900, 901, respectively, that utilize the MEMS die 1000. The exemplary microphone devices 900, 901 both comprise a housing having a sound port, wherein the MEMS die 1000 is disposed within the housing, and wherein the sound port is acoustically coupled to the MEMS die 1000.

Referring to FIG. 13, the MEMS die 1000 used, for example, as an acoustic transducer 1000 is configured to fit within the exemplary microphone device 900. The microphone device 900 includes a housing including a base 902 having a first surface 905 and an opposing second surface 907. The housing further includes a cover 904 (e.g., a housing lid), and an acoustic port 906. In an embodiment the port 906 extends between the first surface 905 and the second surface 907. In one implementation, the base 902 is a printed circuit board. The cover 904 is coupled to the base 902 (e.g., the cover 904 may be mounted onto a peripheral edge of the base 902). Together, the cover 904 and the base 902 form an enclosed volume 908 for the microphone device 900.

As shown in FIG. 13, in an embodiment of the microphone device 900, which is representative of an exemplary bottom-port microphone device, an acoustic port 906 is disposed on the base 902 and is structured to convey sound waves to the MEMS die 1000 located within the enclosed volume 908. The microphone device 900 includes an electrical circuit disposed within the enclosed volume 908. In an embodiment, the electrical circuit includes an integrated circuit (IC) 910. In an embodiment the IC 910 is disposed on the first surface 905 of the base 902. The IC 910 may be an application specific integrated circuit (ASIC). Alternatively, the IC 910 may include a semiconductor die integrating various analog, analog-to-digital, and/or digital circuits. In an embodiment the cover 904 is disposed over the first surface 905 of the base 902 covering the MEMS die 1000 and the IC 910.

As shown in FIG. 14, in an embodiment of the microphone device 901, which is representative of an exemplary top-port microphone device, an acoustic port 906A is disposed on the cover 904 and/or a side wall of the cover 904, and is again structured to convey sound waves to the MEMS die 1000 located within the enclosed volume 908 In the microphone device 901 of FIG. 14, the MEMS die 1000 is illustrated as being disposed on the first surface 905 of the base 902. In other embodiments of the microphone device 901, the MEMS die 1000 can be disposed on other surfaces within the housing, which includes any internal surfaces of the base 902 or the cover 904.

In a further embodiment the MEMS die 1000 is disposed on the first surface 905 of the base 902 as illustrated but further includes openings or cutouts 909 disposed through the substrate portion 118 (see FIG. 14). The cutouts 909 allow the portion of the enclosed volume 908 disposed behind the MEMS die 1000 relative to the port 906A to equilibrate in pressure with the rest of the enclosed volume 908. In other embodiments, one or more vent openings 906B can be disposed, for example, through the cover 904, through the base 902, and/or forming a gap between the cover 904 and the base 902.

In some embodiments, the microphone device 900, 901 forms part of a compact computing device (e.g., a portable communication device, a smartphone, a smart speaker, an internet of things (IoT) device, etc.), where one, two, three or more microphone devices 900, 901 may be integrated for picking-up and processing various types of acoustic signals such as speech and music. The MEMS die 1000, used as an acoustic transducer 1000, converts sound waves, received through acoustic port 906, 906A, into a corresponding electrical microphone signal, and generates an electrical signal (e.g., a voltage) at a transducer output in response to acoustic activity incident on the port 906, 906A.

As shown in FIGS. 13 and 14, the transducer output includes a pad or terminal of the acoustic transducer 1000 that is electrically connected to the electrical circuit via one or more bonding wires 912. The microphone device 900, 901 further includes electrical contacts, shown schematically as contacts 914, typically disposed on a bottom surface of the base 902. The contacts 914 are electrically coupled to the electrical circuit. The contacts 914 are configured to electrically connect the microphone device 900, 901 to one of a variety of host devices.

During operation of the MEMS diaphragm assembly 100 described hereinabove, for example as part of the acoustic transducer 1000 shown in FIGS. 13 and 14, electric charge is applied to the conductive layers 150B and 150C of the stationary electrode assembly 150 and the first and second movable electrodes defined hereinabove as the electrically active regions of the conductive layers 130B, 140B of the first and second diaphragms 130, 140, respectively, thereby inducing an electric field between the stationary electrode(s) of the stationary electrode assembly 150 and the first and second movable electrodes. Movement of the air (e.g., resulting from sound waves) pushes against the outer surface of the MEMS diaphragm assembly 100 facing the opening 122 causing the first and second diaphragms 130, 140 to deflect (enter a deflection state) and to deform. This deformation causes a change in the capacitance between the one or more stationary electrodes of the stationary electrode assembly 150 and the first and second diaphragms 130, 140, which can be detected and interpreted as sound.

As noted hereinabove, a plurality of MEMS devices can be manufactured in a single batch process. Individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes as an acoustic transducer or other portion of a microphone.

Steps in a production process utilized to produce the MEMS diaphragm assembly 100 as described hereinabove include etching, masking, patterning, cutting, boring, and/or release steps executed on a workpiece. All of the steps are not described in detail herein. However, generally the portions of the MEMS diaphragm assembly 100 (and the larger MEMS die 1000 of which it can be a part) that ultimately end up as the structures of the first and second diaphragms 130, 140, the stationary electrode assembly 150, and the plurality of pillars 180 are applied onto a workpiece in particular layers or patterns and the spaces between the structures are created utilizing sacrificial material, or are otherwise bored or etched out of a solid block of material.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical systems (MEMS) diaphragm assembly comprising:
    a first diaphragm;
    a second diaphragm;
    a geometric central region surrounding a geometric center of the diaphragm assembly, the geometric central region being bounded by a constant radius, R1, extending from the geometric center; and
    a plurality of pillars connecting the first and second diaphragms, each of the plurality of pillars having a cross-sectional shape having a maximum radial dimension, A, and a maximum circumferential dimension, B, the plurality of pillars arranged around the geometric center,
    the maximum radial dimension, A, of the plurality of pillars being oriented along a plurality of radials emanating from the geometric center,
    the maximum circumferential dimension, B, of the plurality of pillars being oriented circumferentially relative to the geometric center,
    wherein at least a first subset of the plurality of pillars is disposed within the geometric central region and wherein A is greater than B for the at least first subset.

2. The MEMS diaphragm assembly of claim 1, wherein A and B are constant within the geometric central region, and A is smaller at an outer periphery of the MEMS diaphragm assembly than within the geometric central region.

3. The MEMS diaphragm assembly of claim 2, wherein an outer edge of the geometric central region is disposed in a range of about 30% to 70% of the distance between the geometric center and the outer periphery of the MEMS diaphragm assembly.

4. The MEMS diaphragm assembly of claim 3, wherein the outer edge of the geometric central region is disposed in a range of about 50% to 70% of the distance between the geometric center and the outer periphery of the MEMS diaphragm assembly.

5. The MEMS diaphragm assembly of claim 4, wherein the outer edge of the geometric central region is disposed at about 60% to 70% of the distance between the geometric center and the outer periphery of the MEMS diaphragm assembly.

6. The MEMS diaphragm assembly of claim 2, wherein A is constant from an outer edge of the geometric central region to the outer periphery of the MEMS diaphragm assembly.

7. The MEMS diaphragm assembly of claim 2, wherein the region between an outer edge of the geometric central region and the outer periphery comprises a plurality of concentric annular regions, and wherein A and B are constant within each of the plurality of concentric annular regions.

8. The MEMS diaphragm assembly of claim 2, wherein B is constant and A decreases from the geometric center out to an outer edge of the geometric central region and both A and B remain constant from the outer edge of the geometric central region to the outer periphery of the MEMS diaphragm assembly.

9. The MEMS diaphragm assembly of claim 8, wherein the geometric central region comprises a central core region surrounded by a plurality of concentric annular regions, and wherein A and B are constant within each of the central core region and the plurality of concentric annular regions.

10. The MEMS diaphragm assembly of claim 1, wherein the cross-sectional shape is selected from the group of shapes consisting of an ellipse, a rectangle, a diamond shape, an irregular pentagon, an irregular hexagon, an egg shape, an irregular heptagon, an irregular octagon, an irregular ten-sided polygon, an irregular twelve-sided polygon, a triangle, and combinations thereof.

11. A microelectromechanical system (MEMS) die, comprising:
- a substrate having an opening formed therein; and
- a MEMS diaphragm assembly attached around a periphery thereof to the substrate and over the opening, wherein the diaphragm assembly comprises:
- a first diaphragm;
- a second diaphragm;
- a geometric central region surrounding a geometric center of the diaphragm assembly, the geometric central region being bounded by a constant radius, R1, extending from the geometric center; and
- a plurality of pillars connecting the first and second diaphragms, each of the plurality of pillars having a cross-sectional shape having a maximum radial dimension, A, and a maximum circumferential dimension, B, the plurality of pillars arranged around the geometric center,
- the maximum radial dimension, A, of the plurality of pillars being oriented along a plurality of radials emanating from the geometric center,
- the maximum circumferential dimension, B, of the plurality of pillars being oriented circumferentially relative to the geometric center,
- wherein at least a first subset of the plurality of pillars is disposed within the geometric central region and wherein A is greater than B for the at least first subset;
- wherein A and B are constant within the geometric central region, and A is smaller at an outer periphery of the MEMS diaphragm assembly than within the geometric central region; and
- wherein an outer edge of the geometric central region is disposed in a range of about 30% to 70% of the distance between the geometric center and the outer periphery of the MEMS diaphragm assembly.

12. A microphone device, comprising:
- the MEMS die of claim 11;
- a housing having a sound port;
- wherein the MEMS die is disposed within the housing; and
- wherein the sound port is acoustically coupled to the MEMS die.

13. The MEMS die of claim 11, wherein the outer edge of the geometric central region is disposed in a range of about 50% to 70% of the distance between the geometric center and the outer periphery of the MEMS diaphragm assembly.

14. The MEMS die of claim 11, wherein the outer edge of the geometric central region is disposed at about 60% to 70% of the distance between the geometric center and the outer periphery of the MEMS diaphragm assembly.

15. The MEMS die of claim 11, wherein A is constant from the outer edge of the geometric central region to the outer periphery of the MEMS diaphragm assembly.

16. The MEMS die of claim 11, wherein the region between the outer edge of the geometric central region and the outer periphery comprises a plurality of concentric annular regions, and wherein A and B are constant within each of the plurality of concentric annular regions.

17. The MEMS die of claim 11, wherein B is constant and A decreases from the geometric center out to the outer edge of the geometric central region and both A and B remain constant from the outer edge of the geometric central region to the outer periphery of the MEMS diaphragm assembly.

18. The MEMS die of claim 16, wherein the geometric central region comprises a central core region surrounded by the plurality of concentric annular regions, and wherein A and B are constant within each of the central core region and the plurality of concentric annular regions.

19. The MEMS diaphragm assembly of claim 11, wherein the cross-sectional shape for the at least first subset of the plurality of pillars can be any regular or irregular shape wherein A is greater than B.

20. The MEMS diaphragm assembly of claim 19, wherein the cross-sectional shape is selected from the group of shapes consisting of an ellipse, a rectangle, a diamond shape, an irregular pentagon, an irregular hexagon, an egg shape, an irregular heptagon, an irregular octagon, an irregular ten-sided polygon, an irregular twelve-sided polygon, a triangle, and combinations thereof.

* * * * *